United States Patent
Scafidi

(12) 
(10) Patent No.: US 6,519,156 B2
(45) Date of Patent: *Feb. 11, 2003

(54) SURFACE MOUNTED CONDUCTION HEAT SINK

(75) Inventor: Christopher J. Scafidi, Branford, CT (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/991,456

(22) Filed: Nov. 20, 2001

(65) Prior Publication Data

US 2002/0030973 A1 Mar. 14, 2002

Related U.S. Application Data

(60) Continuation of application No. 09/841,087, filed on Apr. 24, 2001, which is a division of application No. 09/597,535, filed on Jun. 20, 2000, now Pat. No. 6,249,434.

(51) Int. Cl.$^7$ .................................................. H05K 7/20
(52) U.S. Cl. ..................... 361/704; 361/692; 361/707; 361/721; 257/707; 174/16.3
(58) Field of Search .................. 361/690, 702–710, 361/714–718, 722, 749–754, 723; 174/16.3, 52.4, 252, 265; 257/675, 690, 666, 668, 673, 616, 607, 706–727, 792, 786, 789, 737; 165/104.26, 185, 80.2, 80.3, 80.4; 29/602 R, 852, 849, 602.1; 336/849, 632, 200, 83, 198, 252, 265; 363/147, 21, 144; 205/125; 428/210, 131; 228/176, 123.1; 438/3, 616

(56) References Cited

U.S. PATENT DOCUMENTS

| | | |
|---|---|---|
| 4,812,949 A | 3/1989 | Fontan et al. |
| 5,077,638 A | 12/1991 | Andersson et al. |
| 5,184,211 A | 2/1993 | Fox |
| 5,332,869 A | 7/1994 | Hagiwara |
| 5,646,373 A | 7/1997 | Collins et al. |
| 5,710,459 A | 1/1998 | Teng et al. |
| 5,739,586 A | 4/1998 | Cannizzaro et al. |
| 5,746,927 A | 5/1998 | Hashimoto et al. |
| 5,779,134 A | 7/1998 | Watson et al. |
| 5,905,636 A | 5/1999 | Baska et al. |
| 5,907,189 A | 5/1999 | Metrol |
| 5,991,156 A | 11/1999 | Bond et al. |
| 6,008,536 A | 12/1999 | Metrol |
| 6,031,723 A | 2/2000 | Wieloch |
| 6,043,981 A | 3/2000 | Markow et al. |
| 6,075,282 A | 6/2000 | Champagne |
| 6,091,603 A | 7/2000 | Daves et al. |

FOREIGN PATENT DOCUMENTS

JP    409027576 A    1/1997

OTHER PUBLICATIONS

"Thermal Management Products," a catalogue from Chomerics, a division of Parker Hannifin Corp., 68 pp. (1999).
"T–Form 400 Series," a brochure from Thermagon, Inc., 1 p. (Nov. 1999).
"T–pli Series 200," a brochure from Thermagon, Inc., 2 pp. (Oct. 2, 1998).
"A Quick Guide to Thermagon Interface Materials," a brochure from Thermagon, Inc., 2 pp. (1999).
"Heat Transfer Fundamentals," a brochure by Chomerics, a division of Parker Hannifin Corp., obtained from www.chomerics.com/heatransferfund.htlm, 7 pp. (May 30, 2000).

*Primary Examiner*—Darren Schuberg
*Assistant Examiner*—Michael Datskovsky
(74) *Attorney, Agent, or Firm*—Fogg and Associates, LLC; Laura A. Ryan

(57) ABSTRACT

A heat sink is provided that has a leg and a member coupled substantially perpendicular to the leg at a first end of the leg. The leg is surface mountable to a first surface of a printed circuit board at a second end of the leg to receive heat from an electronic device on a second surface of the printed circuit board by a thermally conductive via through the printed circuit board.

26 Claims, 3 Drawing Sheets

SURFACE MOUNTED CONDUCTION HEAT SINK

CROSS REFERENCE TO RELATED APPLICATIONS

This Application is a Continuation of U.S. application Ser. No. 09/841,087 filed Apr. 24, 2001 (allowed), which is a Divisional of U.S. application Ser. No. 09/597,535, filed Jun. 20, 2000 and issued as U.S. Pat. No. 6,249,434 on Jun. 19, 2001.

TECHNICAL FIELD

The present invention is related to heat sinks for printed circuit boards, and more particularly to a system and method of transferring heat from electronic devices using a surface mounted conduction heat sink.

BACKGROUND

Circuit boards are becoming more and more densely packed with electronic devices as the need for power, memory and additional capabilities increases. As a result the heat generated by these electronic devices also increases. The heat that is generated by an electronic device must be transferred away from the electronic device or the performance of the electronic device(s) will deteriorate. The problem of dissipating heat from electronic devices mounted on circuit boards gets worse when the piece of equipment employing the circuit board is mounted within a housing. For example, fiber optic transmitter/receiver modules that include circuit boards are often environmentally sealed in a housing to prevent damage from the elements. As a result, the ability to dissipate heat from the electronic devices mounted on the circuit boards becomes challenging. The environmental housing's only mode of heat transfer to the ambient is natural convection. The transmitter/receiver module's only mode of heat transfer to the environmental housing is conduction.

A classic thermal management technique uses thermal vias to dissipate heat. The thermal vias are located in a copper pad of a printed circuit board, under the device that needs cooling. A heat sink pad of a device is soldered to the copper pad of the circuit board. During operation of the device, heat is transferred from the device's heat sink pad to the copper pad on the primary side of the circuit board. The heat is then transferred through the thermal vias to the far (secondary) side of the circuit board and to the housing of the transmitter/receiver module. The heat is then transferred by conduction from the transmitter/receiver module to the unit's environmental housing. As the component density in an electronic module increases, it becomes difficult to use classical thermal vias to dissipate heat.

For the reasons stated above, and for other reasons stated below which will become apparent to those skilled in the art upon reading and understanding the present specification, there is a need in the art for

SUMMARY

The above-mentioned problems with meeting the thermal requirements of electronic devices mounted on circuit boards are addressed by the present invention and will be understood by reading and studying the following specification. Embodiments of the present invention provide heat sinks for facilitating meeting the thermal requirements of electronic devices mounted on circuit boards.

More particularly, in one embodiment, a heat sink is provided that has a leg and a member coupled substantially perpendicular to the leg at a first end of the leg. The leg is surface mountable to a first surface of a printed circuit board at a second end of the leg to receive heat from an electronic device on a second surface of the printed circuit board by a thermally conductive via through the printed circuit board.

In another embodiment, a heat sink is provided that has a first U-shaped portion, a second U-shaped portion, and a pair of thermally conductive vias. The first U-shaped portion is mountable on a first surface of a printed circuit board for straddling an electronic device on the first surface of the printed circuit board. Further, the first U-shaped portion has an interior surface for thermally coupling to an outer surface of the electronic device. The second U-shaped portion is mountable on a second surface of the printed circuit board. The pair of thermally conductive vias is for passing between the first and second surfaces of the printed circuit board. Moreover, each of the pair of thermally conductive vias is for respectively thermally coupling each of first and second legs of the "U" of the second U-shaped portion to the electronic device.

In yet another embodiment, a method of removing heat from an electronic device is provided. The method includes transferring the heat from an electronic device mounted on a first surface of a printed circuit board to a first heat transfer pad of the electronic device. The method includes transferring the heat from the first heat transfer pad to a second heat transfer pad coupled to the first heat transfer pad, where the second heat transfer pad is on the first surface of a printed circuit board. Moreover, the method includes transferring the heat from the second heat transfer pad to a heat sink that is mounted on a second surface of the printed circuit board and that straddles a component on the second surface using a thermally conductive via that passes through the printed circuit board and that thermally couples the second heat transfer pad to the heat sink. The method also includes transferring the heat from the heat sink to an outer housing that encloses the printed circuit board.

Other embodiments are described and claimed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Since the component density is so high in the new circuit board designs, it is physically impossible to directly contact the far (secondary) side of the printed circuit board with the housing of the device modules as stated in the classic technique. This invention overcomes this obstacle by providing alternate conduction/cooling paths from the electrical device to the housing.

Figure 1:
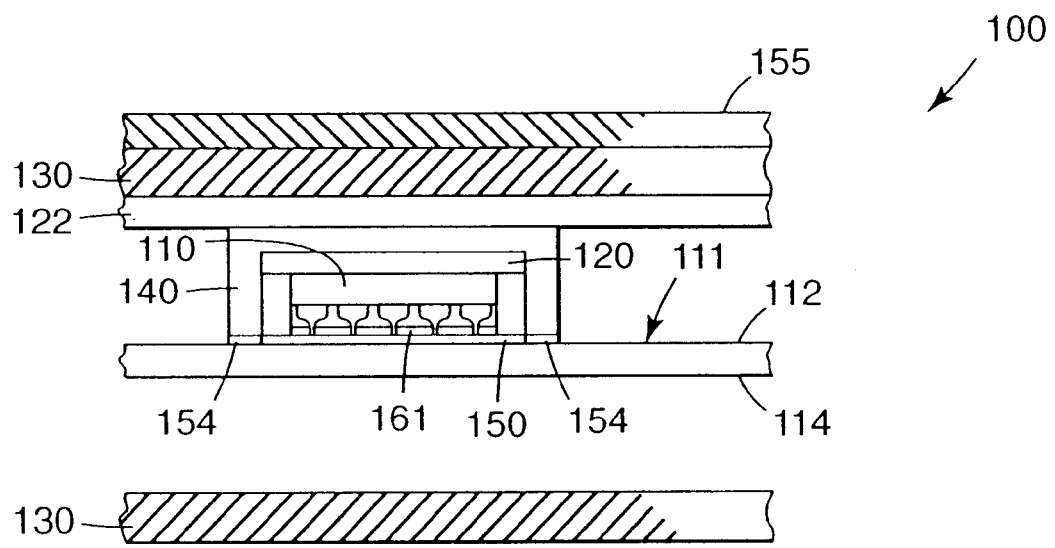
FIG. 1 is an illustration of one embodiment of a heat sink according to the teachings of the present invention.

FIG. 1 is an illustration of one embodiment of a heat sink mounted on a circuit board shown generally at 100 and constructed according to the teachings of the present invention. In this embodiment, an electronic device 110 is mounted on a printed circuit board 111. The printed circuit board 111 has a primary surface 112 and a secondary surface 114. In one embodiment, the electronic device 110 is mounted onto a heat transfer pad 150 on the surface of the printed circuit board 111. In one embodiment, electronic device 110 includes a heat sink pad or heat transfer pad 161 which couples to the heat sink pad 150 on the printed circuit board 111. The electronic device 110 is coupled to heat sink 140 via heat sinking mounting pads 154 thermally coupled to the heat sink pad 150 on the printed circuit board 111. Heat transfer pad 150 on the surface of printed circuit board 111 and heat transfer pad 161 of electronic device 110 are illustrated as being approximately the same width and length as electronic device 110. It is understood that the dimensions of heat transfer pads 150 and 161 are not limited to the dimensions of the electronic device such as 110 that couples to them. The heat transfer pads 150 and 161 may comprise one or more pads larger or smaller than the dimensions of the electronic device 110.

Figure 3:
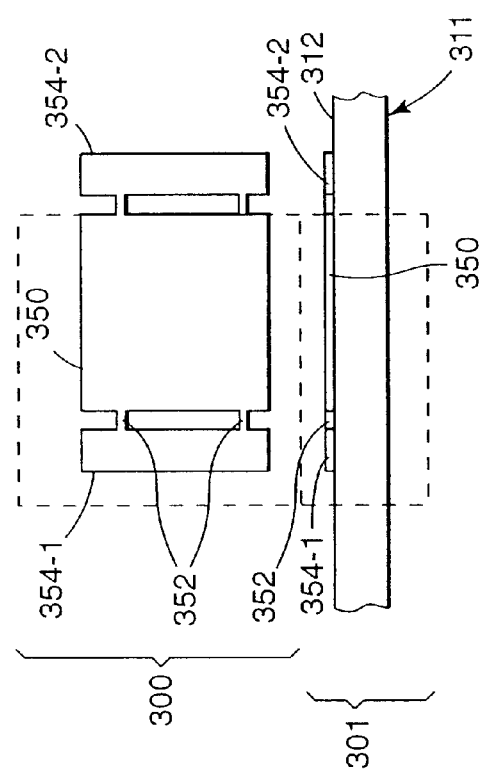
FIG. 3 is an illustration of a top and a side view of an embodiment of a heat transfer pad and heat sink mounting pad according to the teachings of the present invention.

FIG. 3 is an illustration of one embodiment of a top view 300 and a side view 301 of a heat transfer pad 350 and a heat sink mounting pad 354-1 as discussed above. Heat transfer pad 350 and heat sink mounting pad 354-1 are on the top or primary surface 312 of printed circuit board 311. In one embodiment, heat transfer pad 350 is coupled to heat sink mounting pad 354-1 by thermally conductive leads 352. Leads 352 are for illustration and may comprise one or more leads of varying sizes. For example, in one embodiment, heat transfer pad 350 and heat sink mounting pad 354-1 are one continuous pad. In another embodiment, heat transfer pad 350 includes two heat sink mounting pads 354-1 and 354-2 having one or more interconnecting leads such as 352. FIG. 3 illustrates that the heat sink mounting pads 354 are located on opposite sides of heat transfer pad 350. It is understood by one skilled in the art that the heat sink mounting pads 354 are not restricted to the size, shape or location illustrated but may include any number of pads of any shape or location about the heat transfer pad 350.

Figure 4:
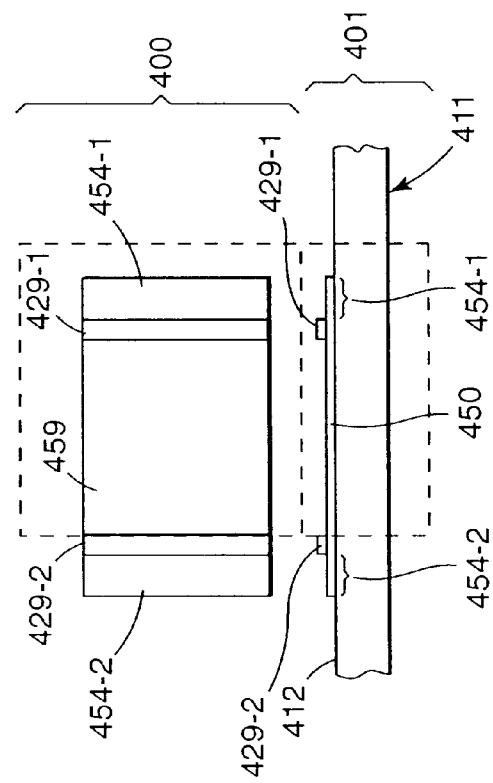
FIG. 4 is an illustration of a top and a side view of an embodiment of a heat transfer pad and solder mask according to the teachings of the present invention.

FIG. 4 is another illustration of one embodiment of a top view 400 and a side view 401 of a heat transfer pad and heat sink mounting pad as a single pad 450 with a solder mask 429-1. Solder mask 429-1 is located on top of pad 450 separating heat transfer pad portion 459 from heat sink mounting pad portion 454-1. Heat transfer pad 450 and solder mask 429-1 are on the top or primary surface 412 of printed circuit board 411. FIG. 4 illustrates a single pad 450 for mounting an electronic device on heat transfer pad portion 459 and mounting a heat sink on heat sink mounting pad portion 454-1. As a result once soldered to pad 459 an electronic device is thermally coupled to a heat sink via single combination heat transfer pad and heat sink mounting pad 450. In an alternate embodiment, solder masks 429-1 and 429-2 are placed on pad 450 so as to form two heat sink mounting pads 454-1 and 454-2 and a single heat transfer pad 459. The use of solder masks in FIG. 4 is by way of illustration only and the method of separating the electronic device from the heat sink on a printed circuit board may include any suitable method such barriers, spacers or the like. The electronic devices, heat sinks, and other components are not limited to soldering but may be attached to the printed circuit board or heat sink pad via surface mounting, soldering using solder balls or the like, thermally and electrically conductive adhesives or other suitable materials having appropriate thermal and electrical properties. It is understood by one skilled in the art that the mounting pads discussed with respect to FIGS. 3 and 4, although shown on top of the printed circuit board, are not restricted to being located on top of the board. For example, the mounting pads may be part of the printed circuit board surface, below the printed board circuit surface or on top of another layer or surface on the printed circuit board.

FIG. 3 illustrates heat sink mounting pads 354 located on opposite sides of heat transfer pad 350 and FIG. 4 illustrates solder masks 454 for separating heat sinks mounted on opposite sides of heat transfer pad portion 459. It is understood by one skilled in the art that the heat sink mounting pads 354 and masks 454 are not restricted to the size, shape or location illustrated but may include any number of pads of any shape or location adjacent to and thermally coupled to heat transfer pads 350 and 450. It is also understood that the heat transfer pads 350 and 450 are not restricted to one single pad, in alternate embodiments, pads 350 and 450 comprise two or more smaller pads that are thermally interconnected to provide a path to draw heat from the electronic device.

Heat sink mounting pads 354 and heat transfer pad 350 and 450 are made of a thermally conductive material such as copper. For an alternate embodiment of the present invention, the pads and interconnects are formed from other suitable materials having appropriate thermal and electrical properties such as, for example, aluminum, gold, silver, or other metal. In addition, to improve the thermal conductive properties of the pads 350, 354 and 450, the pads may include a thermal insert layer such as T-PLI™, T-FORM™, CHO-THERM™, or thermally and electrically conductive adhesives or pastes or other suitable materials having appropriate thermal and electrical properties. T-PLI™ and T-FORM™ are thermal interface materials manufactured by Thermagon, Inc., 4707 Detroit St., Cleveland, Ohio 44109. CHO-THERM™ is a thermal interface material manufactured by Chomerics, a division of Parker Hannifin, 77 Dragon Court, Woburn, Mass. 01888

In operation, an electronic device such as 110 of FIG. 1, heats up. The heat is transferred to a heat transfer pad such as 350 and to heat sink 140 via heat sink mounting pads such as 354. In another embodiment, the heat is transferred to heat sink 140 via a heat transfer pad such as 450. Heat sink 140 conducts the heat away from electronic device 110. In one embodiment, the printed circuit board 111 is mounted into a housing 130 and heat sink 140 is thermally coupled to housing 130. In this embodiment, heat sink 140 conducts the heat to housing 130 that in turn disperses the heat to the ambient air. In another embodiment, heat sink 140 straddles the electronic device 110 and is thermally coupled with the top of the electronic device 110 and draws heat from the surface of the electronic device 110. In one embodiment, heat sink 140 includes a thermally conductive interface layer 120 between the electronic device 110 and the heat sink 140. The thermal interface layer 120 consists of a thermal interface material such as T-PLI™, T-FORM™, CHO-THERM™, or the like. In another embodiment, the heat sink 140 is coupled to an outer housing 130 that includes an inner layer of a thermally conductive material 122 such as T-PLI™, T-FORM™, CHO-THERM™, or the like. In an alternate embodiment, heat sink 140 includes a layer of thermally conductive material such as T-PLI™, T-FORM™, CHO-THERM™, or the like.

In one embodiment, printed circuit board 111 is part of a fiber optic transmitter/receiver module within housing 130. In another embodiment, the fiber optic transmitter/receiver module is environmentally sealed within a second housing 155. In one embodiment, the transmitter/receiver module housing 130 is thermally coupled to environmentally sealed housing 155. In another embodiment, environmentally sealed housing 155 includes an inner layer of a thermally conductive material between the transmitter/receiver module housing 130 and the environmentally sealed housing 155. The thermally conductive material comprises a material such as T-PLI™, T-FORM™, CHO-THERM™, or the like.

Figure 2:
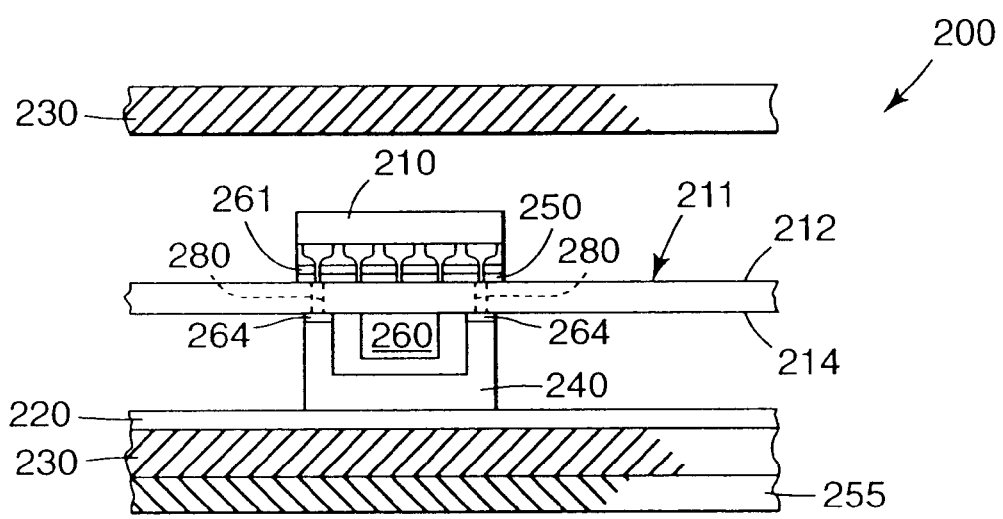
FIG. 2 is an illustration of another embodiment of a heat sink according to the teachings of the present invention.

FIG. 2 is an illustration of another embodiment of a heat sink mounted on a circuit board, shown generally at 200, and constructed according to the teachings of the present invention. A circuit board 211 has a primary surface 212 and a secondary surface 214. In this embodiment, an electronic device 210 is mounted to the primary surface 212 of circuit board 211. In one embodiment, electronic device 210 includes a heat transfer pad 261 coupled to the bottom of electronic device 210. The heat transfer pad 261 draws heat from the electronic device 210. In one embodiment, electronic device 210 is mounted to a heat transfer pad 250 that is on the primary surface 212 of the circuit board 211 and aids in drawing heat from electronic device 210. A component 260 is mounted to the secondary surface 214 of circuit board 211. Component 260 may be an electronic device, an enclosure for an electronic device, a spacer or any other component mounted on the printed circuit board. A heat sink 240 is coupled to the secondary surface 214 of circuit board 211. In one embodiment, circuit board 211 includes thermal vias 280 which are formed through circuit board 211 and aid in conducting heat from electronic device 210 on the primary side 212 through the printed circuit 211 to heat sink 240 on the secondary side 214. Electronic device 210 on the primary side is thermally coupled to heat sink 240 on the secondary side by vias 280. Although only two vias 280 are illustrated with respect to FIG. 2, it is understood that any number of vias as appropriate may be utilized to aid in conducting heat from electronic devices such as 210 mounted on the circuit board 211. In one embodiment, heat sink 240 includes thermally conductive heat sink mounting pads 264 that aid in conducting heat from electronic device 210 through vias 280.

A thermal via is a thermally conductive conduit through which heat is conducted. In one embodiment, thermal vias 280 are formed by drilling holes through printed circuit board 211 and filling the hole with a thermally conductive material such as copper. In alternate embodiments, thermal vias 280 are formed by drilling, routing, punching holes or slots, or the like in the printed circuit board 211 and filling with an appropriate thermally conductive material.

In operation, electronic component 210 heats up, this heat is transferred to heat sink 240 by thermal vias 280. In one embodiment, the heat is transferred to a heat sink pad such as 350 or 450 of FIGS. 3 and 4, respectively, and then transferred to heat sink 240 by thermal vias 280. In one embodiment, printed circuit board 211 is enclosed in a housing 230 and heat sink 240 is thermally coupled to housing 230. The heat is conducted from heat sink 240 to enclosure 230 for dispersion to the ambient air. In an alternate embodiment, enclosure 230 includes a layer of thermally conductive material 220, such as T-PLI™, T-FORM™, CHO-THERM™, that is thermally coupled to heat sink 240 and aids in the conduction of heat from the heat sink 240 to the housing 230.

In one embodiment, printed circuit board 211 is part of a fiber optic transmitter/receiver module within housing 230. In another embodiment, the fiber optic transmitter/receiver module is environmentally sealed within a second housing 255. In one embodiment, the transmitter/receiver module housing 230 is thermally coupled to environmentally sealed housing 255. In another embodiment, environmentally sealed housing 255 includes an inner layer of a thermally conductive material between the transmitter/receiver module housing 230 and the environmentally sealed housing 255. The thermally conductive material comprises a material such as T-PLI™, T-FORM™, CHO-THERM™, or the like.

Figure 5:
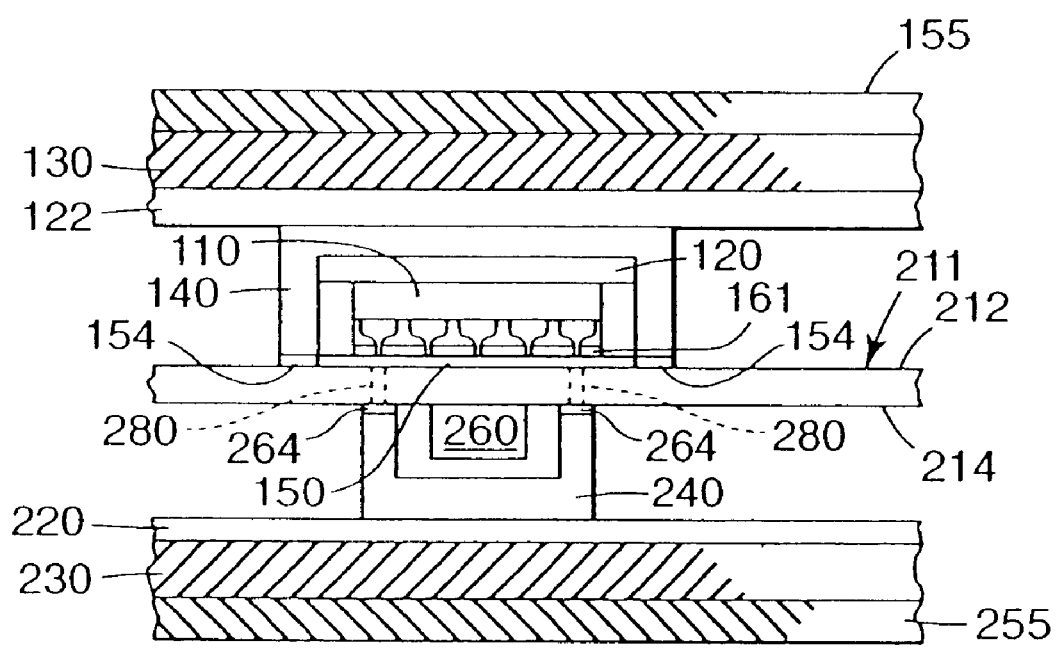
FIG. 5 is an illustration of a heat sink according to another embodiment of the present invention.

In another embodiment, both the heat sink 140 described with respect to FIG. 1 and the heat sink 240 described with respect to FIG. 2 are employed on one circuit board to draw heat from electronic devices, as shown in FIG. 5. Heat sinks 140 and 240 may be employed in any combination for one or more electronic components. It is understood that components such as electronic device 110 and 210, heat sink 140 and 240, component 260 may be coupled to the printed circuit in a number of ways to include surface mounting, soldering using solder balls or the like, thermally and electrically conductive adhesives or any other suitable materials having appropriate thermal and electrical properties.

In one embodiment, the heat sinks described are made of a thermally conductive material such as copper. For an alternate embodiment of the present invention, the heat sinks are formed from other suitable materials having appropriate thermal and electrical properties such as, for example, aluminum, gold, silver, or other metal.

The electronic devices, heat sinks, and other components mounted on the circuit board are not limited to soldering but may be attached to the printed circuit board or heat sink pads via surface mounting, soldering using solder balls or the like, thermally and electrically conductive adhesives or other suitable materials having appropriate thermal and electrical properties.

CONCLUSION

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. For example, the heat sink in one embodiment is a "U" shape and straddles the electronic device. In further embodiments, the heat sink is "L" shaped and is thermally coupled to the top of the electronic device from one side. In other embodiments, the heat sink has four legs and straddles the electronic device. Each of the legs thermally couples to the electronic device. It is understood that the heat sink can be one of a variety of shapes that thermally couple to one or more electronic devices. In addition, in one embodiment the heat sink is employed in a fiber optic transmitter/receiver module that is environmentally sealed in a housing in other embodiments, the heat sink is employed in housings that are not environmentally sealed and in applications other than fiber optic transmitter/receiver modules. Further, in one embodiment the heat sink aids in drawing heat away from an electronic device, in other embodiments, the heat sink aids in drawing heat away from one or more electronic devices. For example, a heat sink is thermally coupled to one or more electronic devices, heat transfer pads and/or thermal vias or any combination of electronic devices, heat transfer pads and thermal vias to aid in drawing heat away from one or more electronic devices.

What is claimed is:

1. A heat sink comprising:

a leg;

a member coupled substantially perpendicular to the leg at a first end of the leg; and wherein the leg is surface mountable to a first surface of a printed circuit board at a second end of the leg to receive heat from an electronic device on a second surface of the printed circuit board by a thermally conductive via through the printed circuit board.

2. The heat sink of claim 1, wherein the leg and the member substantially form an "L" shape.

3. The heat sink of claim 1, wherein the leg comprises a pair of substantially parallel vertical legs and wherein the member is coupled between the pair of substantially parallel vertical legs to substantially form a "U" shape.

4. The heat sink of claim 1, wherein the leg comprises a plurality of substantially parallel vertical legs.

5. The heat sink of claim 1, wherein the member comprises a layer of thermal interface material for thermally coupling the heat sink to a housing that encloses the printed circuit board.

6. The heat sink of claim 1, further comprising a thermally conductive heat sink mounting pad at the second end of the leg.

7. A heat sink comprising:

a first U-shaped portion mountable on a first surface of a printed circuit board for straddling an electronic device on the first surface of the printed circuit board, the first U-shaped portion having an interior surface for thermally coupling to an outer surface of the electronic device;

a second U-shaped portion mountable on a second surface of the printed circuit board; and a pair of thermally conductive vias for passing between the first and second surfaces of the printed circuit board, each of the pair of thermally conductive vias for respectively thermally coupling each of first and second legs of the "U" of the second U-shaped portion to the electronic device.

8. The heat sink of claim 7, further comprising a heat transfer pad disposed between the electronic device and the first surface for mounting the electronic device to the first surface and thermally coupling the electronic device to each of the pair of vias at the first surface.

9. The heat sink of claim 7, wherein the first and second U-shaped portions are adapted to be thermally coupled to an outer housing that encloses the printed circuit board.

10. The heat sink of claim 7, further comprising a thermal interface material disposed on outer surfaces of each of the first and second U-shaped portions for thermally coupling the heat sink to an outer housing that encloses the printed circuit board.

11. The heat sink of claim 7, wherein the second U-shaped portion is adapted to straddle a component on the second surface.

12. The heat sink of claim 7, further comprising a thermally conductive heat sink mounting pad at an end of each of the first and second legs of the "U" of the second U-shaped portion.

13. A method of removing heat from an electronic device, the method comprising:

transferring the heat from an electronic device mounted on a first surface of a printed circuit board to a first heat transfer pad of the electronic device;

transferring the heat from the first heat transfer pad to a second heat transfer pad coupled to the first heat transfer pad, wherein the second heat transfer pad is on the first surface of a printed circuit board;

transferring the heat from the second heat transfer pad to a heat sink that is mounted on a second surface of the printed circuit board and that straddles a component on the second surface using a thermally conductive via that passes through the printed circuit board and that thermally couples the second heat transfer pad to the heat sink; and transferring the heat from the heat sink to an outer housing that encloses the printed circuit board.

14. The method of claim 13, wherein transferring the heat from the second heat transfer pad to the heat sink comprises transferring the heat from the thermally conductive via to a heat sink mounting pad thermally coupled between the heat sink and the thermally conductive via.

15. The method of claim 13, wherein transferring the heat from the heat sink to the outer housing comprises transferring the heat through a layer of thermal interface material disposed between the outer housing and the heat sink.

16. A method of removing heat from an electronic device, the method comprising:

transferring a first portion of the heat from an electronic device mounted on a first surface of a printed circuit board to a first heat sink mounted on the first surface of a printed circuit board, the first heat sink having an interior surface thermally coupled to an outer surface of the electronic device;

transferring a second portion of the heat from the electronic device to a heat transfer pad thermally coupled to the electronic device;

transferring the second portion of the heat from the heat transfer pad to a second heat sink that is mounted on a second surface of the printed circuit board using a thermally conductive via that passes through the printed circuit board and that thermally couples the heat transfer pad to the second heat sink; and transferring the first and second portions of the heat respectively from the first and second heat sinks to an outer housing that encloses the printed circuit board.

17. The method of claim 16, wherein transferring the first and second portions of the heat respectively from the first and second heat sinks to the outer housing comprises transferring the first and second portions of the heat respectively through a first layer of thermal interface material disposed between the outer housing and the first heat sink and through a second layer of thermal interface material disposed between the outer housing and the second heat sink.

18. A method of cooling an electronic device, the method comprising:

forming a thermally conductive via between first and second surfaces of a printed circuit board;

thermally coupling the electronic device to the thermally conductive via at the first surface using a heat transfer pad; and thermally coupling a heat sink to the thermally conductive via at the second surface, wherein the heat sink straddles a component on the second surface.

19. The method of claim 18, wherein thermally coupling the heat sink to the thermally conductive via comprises using a heat sink mounting pad.

20. The method of claim 18, further comprising thermally coupling the heat sink to a housing that encloses the printed circuit board.

21. The method of claim 18, wherein thermally coupling the heat sink to the housing comprises using a thermal interface material.

22. A method of cooling an electronic device, the method comprising:
- forming a thermally conductive via between first and second surfaces of a printed circuit board;
- thermally coupling the electronic device to the thermally conductive via at the first surface using a heat transfer pad;
- thermally coupling an outer surface of the electronic device to an interior surface of a first heat sink; and
- thermally coupling a second heat sink to the thermally conductive via at the second surface.

23. The method of claim 22, further comprising thermally coupling the first and second heat sinks to a housing that encloses the printed circuit board.

24. The method of claim 23, wherein thermally coupling the first and second heat sinks to the housing comprises using a thermal interface material.

25. The method of claim 22, wherein thermally coupling the second heat sink to the thermally conductive via comprises straddling a component mounted on the second surface with the second heat sink.

26. The method of claim 22, wherein thermally coupling the outer surface of the electronic device to the interior surface of a first heat sink comprises straddling the electronic device with the first heat sink.

* * * * *